(12) United States Patent
McCormack et al.

(10) Patent No.: US 7,513,037 B2
(45) Date of Patent: Apr. 7, 2009

(54) METHOD OF EMBEDDING COMPONENTS IN MULTI-LAYER CIRCUIT BOARDS

(75) Inventors: Mark Thomas McCormack, Livermore, CA (US); Hunt Hang Jiang, San Jose, CA (US); Michael G. Peters, Santa Clara, CA (US); Yasuhito Takahashi, Nagano (JP)

(73) Assignee: Fujitsu Limited, Kawasaki (JP)

( * ) Notice: Subject to any disclaimer, the term of this patent is extended or adjusted under 35 U.S.C. 154(b) by 358 days.

(21) Appl. No.: 11/060,002

(22) Filed: Feb. 17, 2005

(65) Prior Publication Data
US 2005/0153060 A1   Jul. 14, 2005

Related U.S. Application Data

(62) Division of application No. 09/866,092, filed on May 23, 2001.

(51) Int. Cl.
*H01K 3/10* (2006.01)
(52) U.S. Cl. .............................. 29/852; 29/830; 29/832; 29/847; 174/262; 438/107
(58) Field of Classification Search ........... 29/830–832, 29/834, 841, 846, 847, 852; 174/260, 262; 257/700, 703, 758, 782, 783; 361/719, 760, 361/763, 764, 792, 795; 427/96.1; 438/107
See application file for complete search history.

(56) References Cited

U.S. PATENT DOCUMENTS

| | | | |
|---|---|---|---|
| 3,903,590 A | * | 9/1975 | Yokogawa .................. 438/107 |
| 5,081,563 A | * | 1/1992 | Feng et al. .................. 361/795 |
| 5,241,456 A | * | 8/1993 | Marcinkiewicz et al. .... 361/792 |
| 5,527,741 A | * | 6/1996 | Cole et al. .................. 438/107 |
| 6,025,995 A | * | 2/2000 | Marcinkiewicz ............ 361/760 |
| 6,545,353 B2 | * | 4/2003 | Mashino ..................... 257/700 |

* cited by examiner

*Primary Examiner*—Donghai D. Nguyen
*Assistant Examiner*—Minh Trinh
(74) *Attorney, Agent, or Firm*—Baker Botts L.L.P.

(57) ABSTRACT

A method for producing a circuit board having an integrated electronic component comprising providing a circuit board substrate having a first substrate surface and a second substrate surface, securing an integrated electronic component to the first substrate surface, and disposing a first dielectric layer on the first substrate surface and over the first integrated electronic component. The method additionally includes disposing a metallic layer on the first dielectric layer to produce an integrated electronic component assembly, producing in the integrated electronic component assembly at least one via having a metal lining in contact with the metallic layer, and disposing a second dielectric layer over the via and over the metallic layer. At least one metal-lined opening is formed in the second dielectric layer and in the first dielectric layer to expose at least part of the integrated electronic component, and to couple the metal lining of the opening to the first integrated electronic component to produce a circuit board having at least one integrated electronic component. A multi-layer printed circuit board having at least one prefabricated, integrated electronic component.

11 Claims, 7 Drawing Sheets

METHOD OF EMBEDDING COMPONENTS IN MULTI-LAYER CIRCUIT BOARDS

CROSS-REFERENCE TO RELATED APPLICATION

This application claims priority as a division of U.S. patent application Ser. No. 09/866,092, filed May 23, 2001, published Nov. 28, 2002, (Pub. No. U.S. 2002/0175402), the entire disclosure of which is incorporated by reference.

FIELD OF THE INVENTION

The present invention relates to multi-layer substrates. More specifically, the present invention provides a circuit apparatus and a method for embedding electronic components within multi-layer substrates, particularly printed circuit boards.

DESCRIPTION OF THE PRIOR ART

A patentability investigation was conducted and the following U.S. Patents were discovered: U.S. Pat. No. 6,021,050 to Ehman, et al.; U.S. Pat. No. 5,745,984 to Cole, Jr., et al.; and U.S. Pat. No. 5,564,181 to Dineen, et al. These U.S. Patents are fully incorporated herein by reference thereto as if repeated verbatim immediately hereinafter.

U.S. Pat. No. 6,021,050 to Ehman, et al. discloses a multi-layered printed circuit board having a plurality of buried passive components, which include resistors, capacitors and inductors. The passive components are formed within layers from thick polymer ink films that are screen printed onto the printed circuit board and fired at temperatures compatible with circuit board materials. Appropriate conducting layers are included within the circuit board as required for the specific components. Film layers are disclosed as including resistive pastes or polymer inks for resistors, dielectric inks for capacitors, and magnetic or ferrite polymer inks for inductors. Ehman, et al's method for producing multi-layered printed circuit board may be costly at times due to the fact that the passive components are built up out of individual resistive, capacitive or inductive elements within the circuit board.

U.S. Pat. No. 5,745,984 to Cole, Jr., et al. discloses an adhesive for use in multi-chip packaging. The adhesive has dielectric properties that result in a lower loss tangent, which makes it particularly useful for use in MCM fabrication of high frequency electronics. U.S. Pat. No. 5,745,984 to Cole, Jr., et al. also discloses encapsulated modules which are used as components, and not as a circuit board for mounting other components. Cole, Jr., et al. does not disclose an improved and cost effective method for producing printed circuit boards having prefabricated components.

U.S. Pat. No. 5,564,181 to Dineen, et al. teaches a method of fabricating a laminated substrate assembly chips-first multichip module including mounting a plurality of electronic components having a predetermined thickness to a flat substrate in a precise position and orientation. A mechanical spacer layer is disclosed as including a cured film, and an adhesive is bonded on the substrate and about the components. The mechanical spacer layer has approximately the same predetermined thickness as the components and has a plurality of holes with the precise position and orientation of the components mounted on the substrate. A cover layer is disclosed as being bonded over the mechanical spacer layer and the tops of the components. Thus, U.S. Pat. No. 5,564,181 to Dineen, et al. is directed to a method for producing a multi-chip module incorporating the step of thinning the components and/or adding spacers about individual components to maintain a uniform top surface height. U.S. Pat. No. 5,564,181 Dineen et al. does not disclose an efficient means for embedding components into printed circuit boards.

Therefore, what is needed and what has been invented is a cost effective electrical assembly which may be produced by an efficient cost-effective method for embedding electronic components within multi-layer substrates, such as a printed circuit board. The components include normally detached integrated electronics, or passive electronics, with specific embodiments including petrovskite capacitance materials, such as PZT and BST. Embedding components enables numerous microFarads of capacitance for bypass applications in high frequency applications.

SUMMARY OF THE INVENTION

Embodiments of the present invention provide a method for producing a circuit board having an integrated electronic component comprising providing a circuit board substrate having a first substrate surface and a second substrate surface; securing a first integrated electronic component to the first substrate surface; and disposing a first dielectric layer on the first substrate surface and over the first integrated electronic component. The method may also comprise disposing a metallic layer on the first dielectric layer to produce an integrated electronic component assembly; producing in the integrated electronic component assembly at least one via having a metal lining in contact with the metallic layer; disposing a second dielectric layer over the via and over the metallic layer; and producing at least one opening in the second dielectric layer and in the first dielectric layer to expose at least part of the first integrated electronic component. A metal lining may be formed in the opening such as to be coupled to the first integrated electronic component to produce a circuit board having at least one integrated electronic component. The circuit board substrate may also include a first metallic layer disposed on the first substrate surface and a second metallic layer disposed on the second substrate. The circuit board substrate may comprise a multi-layer core substrate and include at least one via passing through the circuit board from the first substrate surface to the second substrate surface. The method preferably additionally comprises patterning the first metallic layer to expose at least a portion of the first substrate surface. The first integrated electronic component may be secured to the exposed portion of the first substrate surface. The method may further additionally comprise patterning the second metallic layer to expose at least a portion of the second substrate surface, and connecting a second integrated electronic component to the exposed portion of the second substrate surface. A cavity may be formed in the exposed portion of the second substrate surface, and a second integrated electronic component may be disposed in the cavity. The first integrated electronic component preferably includes at least one first pad in contact with the metal lining in the opening. At least one metal-lined blind via may be formed through the metallic layer, through the first dielectric layer and coupled to the metallic layer.

Embodiments of the present invention also provide a multi-layer printed circuit board having at least one prefabricated integrated electronic component comprising a circuit board substrate having a first substrate surface and a second substrate surface. A first integrated electronic component is secured to the first substrate surface; and a first dielectric layer is disposed on the first substrate surface and over the first integrated electronic component. A metallic layer is disposed on the first dielectric layer and at least one via passes through the first dielectric layer and includes a metal lining in contact with the metallic layer. The multi-layer printed circuit board additionally includes a second dielectric layer disposed over the via and over the metallic layer. The first dielectric layer and the second dielectric layer have a structure defining at least one metal-lined opening exposing at least part of the first integrated electronic component. The first patterned metallic layer is formed on the first substrate surface and a second patterned metallic layer is formed on the second substrate surface.

The present invention further also provides a method for producing a circuit board having an integrated electronic component comprising: providing a circuit board substrate having a first substrate surface and a second substrate surface; securing a first integrated electronic component to the first substrate surface; disposing a first dielectric layer on the first substrate surface and over the first integrated electronic component; producing at least one via; disposing a metallic layer on the first dielectric layer and in the via to produce an integrated electronic component assembly; disposing a second dielectric layer over said metallic layer; producing at least one opening in the second dielectric layer and in the first dielectric layer to expose at least part of the first integrated electronic component; and forming a metal lining in said opening and coupled to the first integrated electronic component to produce a circuit board having at least one integrated electronic component.

These provisions together with the various ancillary provisions and features which will become apparent to those skilled in the art as the following description proceeds, are attained by the methods and electronic circuit boards of the present invention, preferred embodiments thereof being shown with reference to the accompanying drawings, by way of example only, wherein:

DETAILED DESCRIPTION OF PREFERRED EMBODIMENTS OF THE INVENTION

Figure 1:
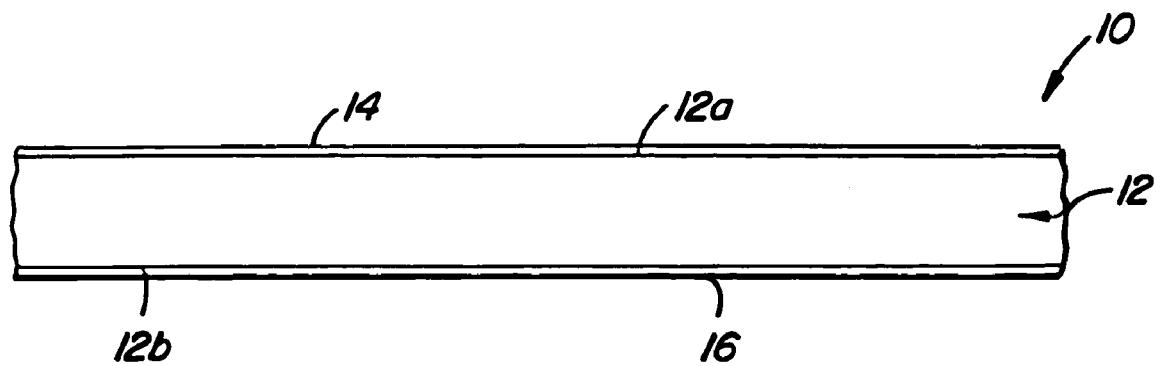
FIG. 1 is a side elevational view of a core substrate assembly having an upper and lower metal layer.
Figure 10:
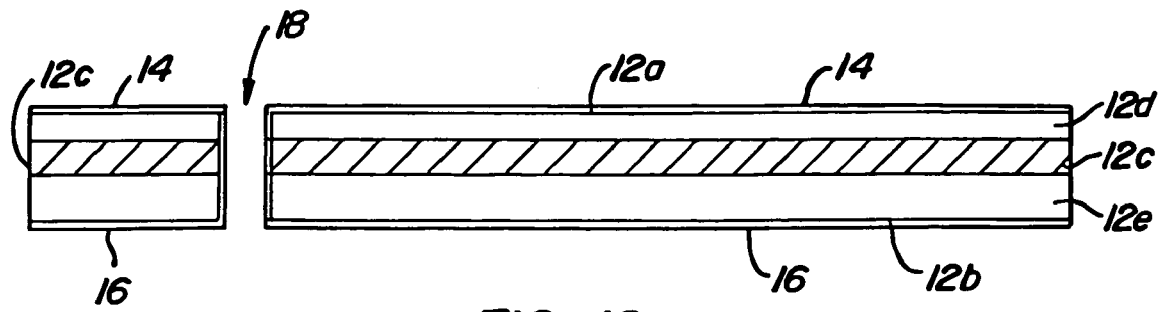
FIG. 10 is a side elevational view of a multi-layer core substrate assembly having an upper and lower metal layer and a conducting-through via.

Referring in detail now to the drawings for various preferred embodiments of the invention, there is seen a core substrate assembly, generally illustrated as 10 and including a core 12 having opposed substrate surfaces 12a and 12b which respectively support metal layers 14 and 16. Metal layers 14 and 16 are optional, and may be any suitable conductive metal, such as copper. The metal layers 14 and 16 may be respectively disposed on the surfaces 12a and 12b by any suitable means, such as by lamination, plating, sputtering or chemical vapor deposition (CVD). The core 12 may be a single layer, as shown in FIG. 1, or the core 12 may contain multilayers, as best shown in FIG. 10 where core 12 is shown as comprising a metal layer 12c and core layers 12d and 12e. The core substrate assembly 10 may also have one or more conducting-through vias, generally illustrated as 18 in FIG. 10.

The metal layers 14 and 16 may be appropriately patterned with any suitable photoresist to respectively, selectively expose substrate surfaces 12a and 12b. Patterning of the metal layers 14 and 16 may be accomplished by etching to develop the desired patterned metal profile. Metal layers 14 and 16 may be etched in any suitable manner, such as by wet etching or by a plasma processing apparatus or in a reactive ion etch (RIE) plasma processing apparatus sold under the trademark AME8100 Etch.™., or under the trademark Precision Etch 5000.™., or under the trademark Precision Etch 8300.™., all trademarks owned by Applied Materials Inc., 3050 Bowers Avenue, Santa Clara, Calif. 95054-3299. Another suitable plasma processing apparatus for etching the metal layers 14 and 16 is that plasma processing apparatus sold under the trademark Metal Etch DPS Centura.™., also owned by Applied Materials, Inc. It is to be understood that other reactive ion etchers may be employed, such as ECR, ICP, Helicon Resonance, etc.

Figure 2:
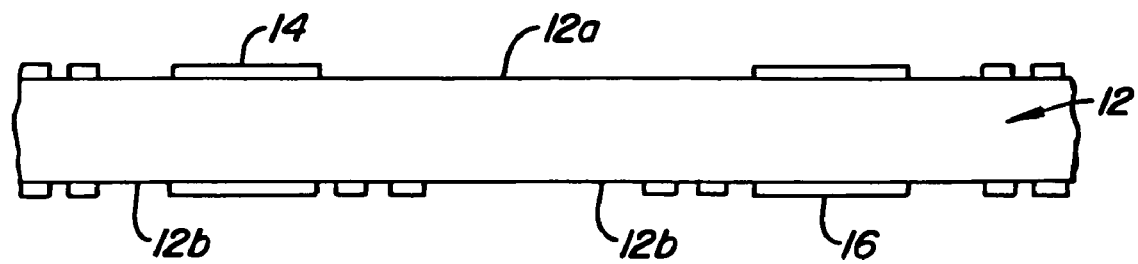
FIG. 2 is a side elevational view of the core substrate assembly of FIG. 1 after the upper and lower metal layers are patterned.
Figure 3:
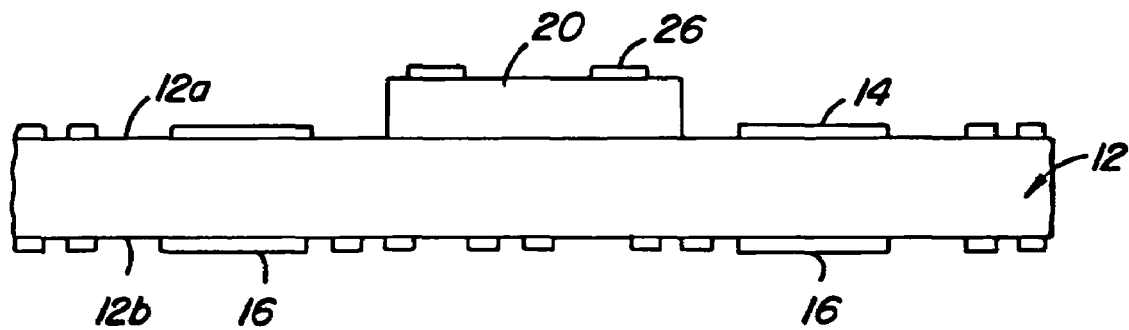
FIG. 3 is a side elevational view of the core substrate assembly of FIG. 2 after a prefabricated, integrated electronic component has been secured to a portion of the surface of the core substrate.
Figure 11:
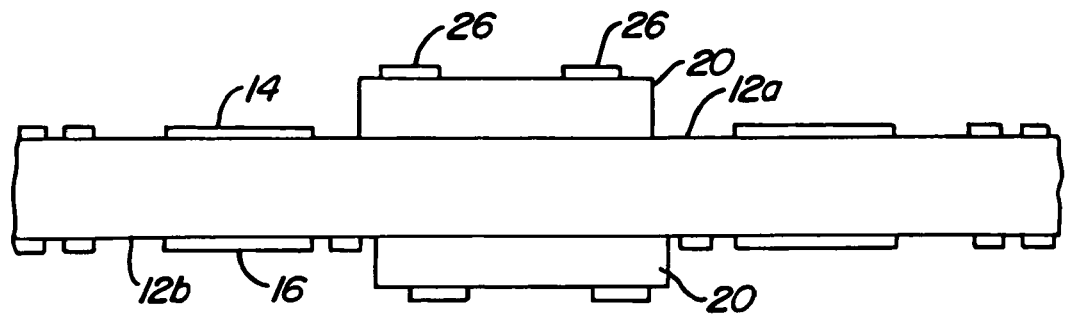
FIG. 11 is a side elevational view of the core substrate assembly of FIG. 1 after the upper and lower metal layers were patterned and after an upper and lower prefabricated, integrated circuit component have been connected to exposed upper and lower substrate surfaces.
Figure 12:
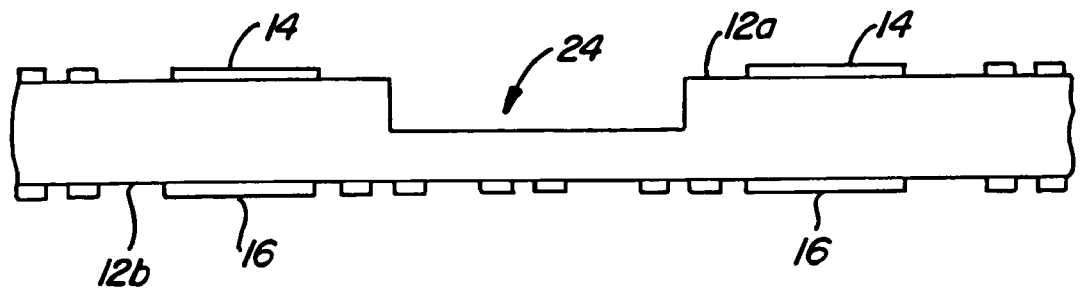
FIG. 12 is a side elevational view of the core substrate assembly of FIG. 2 after a cavity has been placed in the exposed upper surface.
Figure 13:
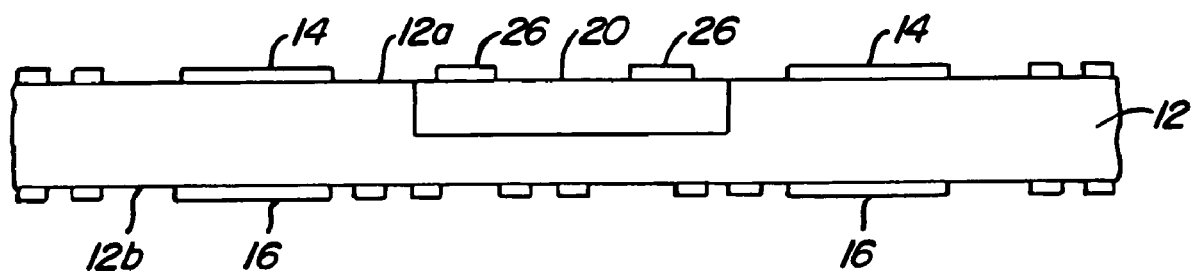
FIG. 13 is a side elevational view of the core substrate assembly of FIG. 12 after a prefabricated, integrated circuit component has been disposed in the cavity.
Figure 14:
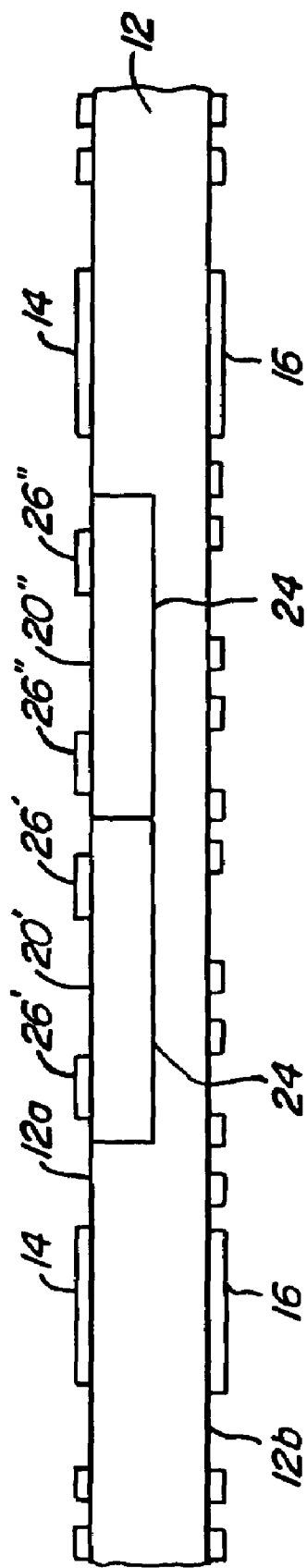
FIG. 14 is a side elevational view of the core substrate assembly of FIG. 12 after two, prefabricated, integrated circuit components have been disposed in the cavity.
Figure 15:
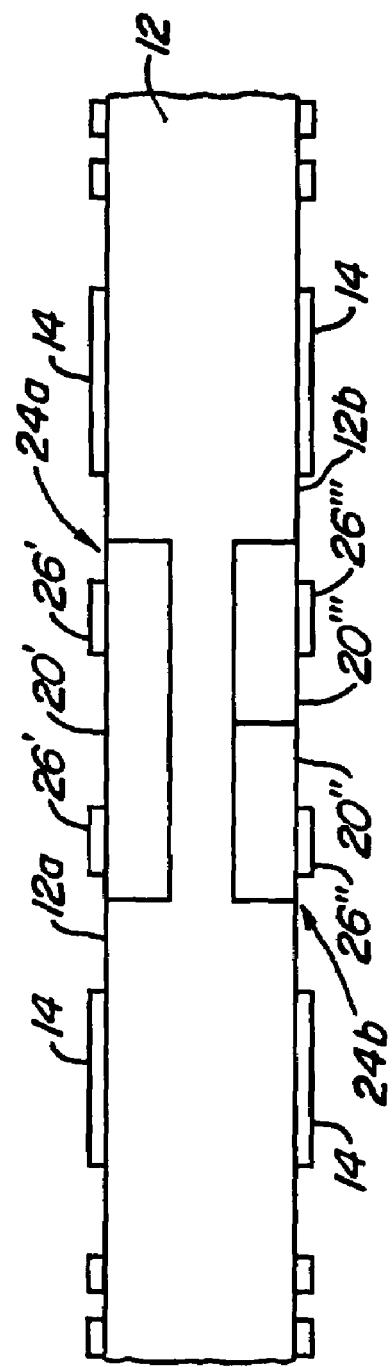
FIG. 15 is a side elevational view of a core assembly after a cavity has been placed in the exposed upper and lower surfaces.

After the metal layers 14 and 16 have been appropriately patterned to expose substrate surfaces 12a and 12b (as shown in FIG. 2), a prefabricated integrated circuit component 20 may be coupled to substrate surface 12a as shown in FIG. 3, or to both substrate surfaces 12a and 12b as shown in FIG. 11. In one embodiment of the present invention one substrate surface 12a may have a cavity generally illustrated as 24 in FIG. 12. The cavity 24 may be formed by any suitable means, such as by milling, cutting or drilling. One or more prefabricated, integrated circuit components 20 (e.g., resistors, capacitors, inductors, etc.) may be conveniently disposed in the cavity 24, as shown in FIG. 13. Alternatively, two prefabricated integrated circuit components may be disposed in the cavity. As shown in FIG. 14, cavity 24 accommodates a first integrated circuit component 20' having pads 26' and a second integrated circuit component 20" having pads 26". Another embodiment of the present invention is shown in FIG. 15 as a side sectional view of core substrate 12 having a cavity 24a in substrate surface 12a and a cavity 24b in substrate surface 12b. Either cavity 24a or 24b may have one or more integrated circuit components. As an example of the present invention, cavity 24a is shown accommodating a first integrated circuit component 20' having pads 26', and cavity 24b is shown accommodating a second integrated circuit component 20" having pad 26" and a third integrated circuit component 20''' having pad 26'''.

The integrated circuit component 20 may include one or more conductor pads 26 and may be any suitable integrated circuit component 20, including those having embedded perosvkite capacitance materials, such as PZT and BST, to provide sufficient bypass capacitance to both enable>GHz speeds and to occupy less space on the module face than would otherwise be occupied by hundreds of discrete passives, such as LICAs. Also, such integrated circuit components including perovskite capacitance materials may be placed directly beneath a suitable semiconductor, whereas LICAs are typically disposed along a periphery. Each integrated circuit component 20 may be secured to a desired location by any suitable adhesive, In some embodiments of the present invention, the integrated circuit component 20 may be secured electrically to a suitable metal pad or layer (not shown) instead of to substrate surface 12a or substrate surface 12b. Additional underfill, glop-top, or other adhesive/sealant materials may optionally be dispensed over the integrated circuit component 20 prior to any thermal treatment.

Figure 4:
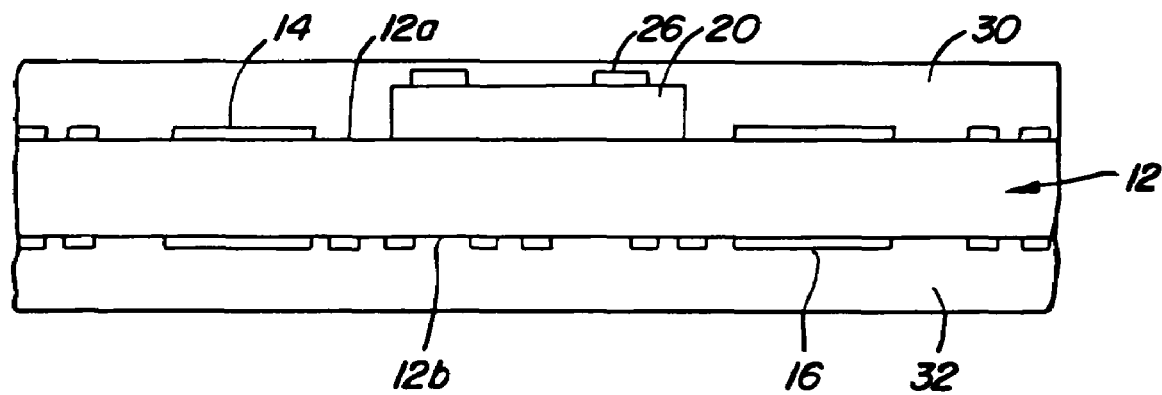
FIG. 4 is a side elevational view of the core substrate assembly of FIG. 3 after a dielectric layer has been disposed over the patterned upper metal layer and the prefabricated, integrated electronic component and after another dielectric layer has been disposed over the patterned lower metal layer.
Figure 6:
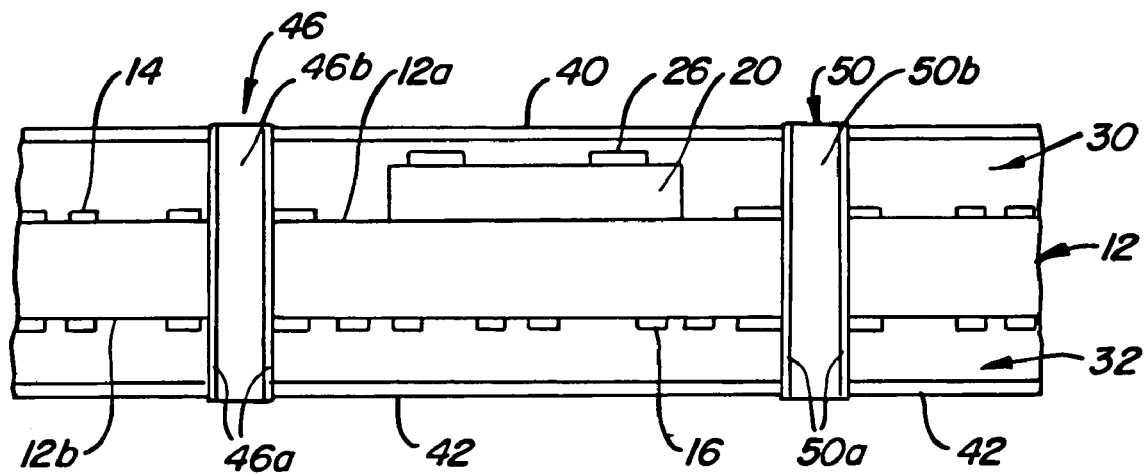
FIG. 6 is a side elevational view of the core substrate assembly of FIG. 5 after a pair of metal-lined vias have been formed through and from the first metal layer to and through the second metal layer.

After one or more of the integrated circuit components 20 have been suitable disposed where desired, dielectric layers 30 and 32 may be respectively placed, flowed or laminated over the integrated circuit component 20, over the patterned metal layer 14, over the exposed portions of substrate surface 12a, and over the patterned metal layer 16 including the exposed portions of substrate surface 12b (as best shown in FIG. 4). As previously indicated, additional underfill, glop-top, or other adhesive/sealant materials may optionally be dispensed over the integrated circuit components 20 prior to any subsequent processing. Subsequently, a pair of metal (e.g., copper) layers 40 and 42 may be placed (e.g., by lamination, e-less plating, or the like) over dielectric layers 30 and 32 to produce the circuit board assembly, as best shown in FIG. 6.

Figure 7:
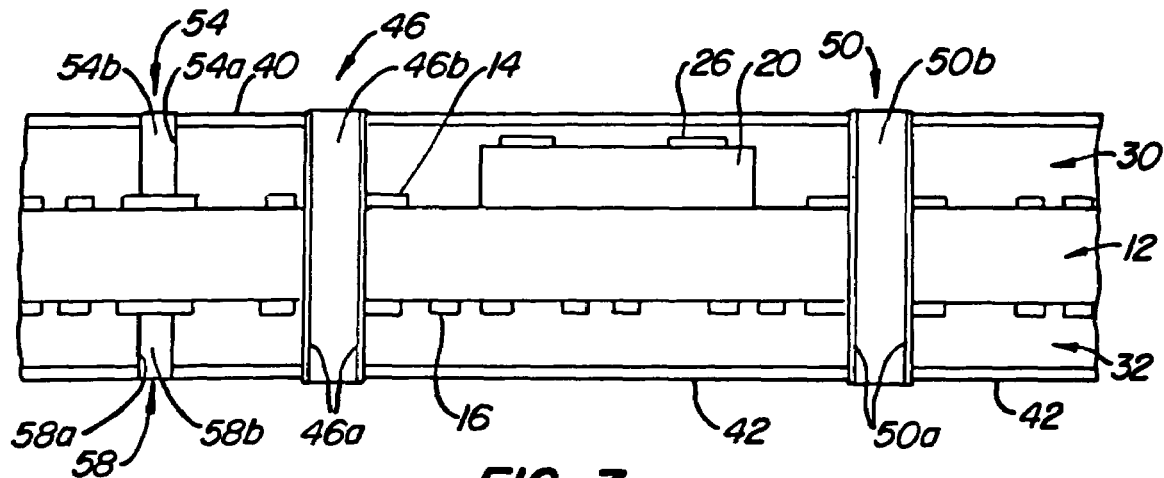
FIG. 7 is a side elevational view of the core substrate assembly of FIG. 6 after a pair of blind metal-lined vias were drilled therein.

One or more metal-lined vias may be subsequently formed in the circuit board assembly of FIG. 5. In FIG. 6, there is seen a pair of metal-lined vias 46 and 50 formed by drilling openings through the entire FIG. 5 circuit board assembly; more specifically openings passing through metal layers 40 and 42, through dielectric layers 30 and 32, through residual metal layers remaining from patterned metal layers 14 and 16, and through the core 12. The opening for vias 46 and 50 are metal-lined (e.g., copper lined) with metal liners 46a and 50a by any suitable process, such as by e-less plating in combination with electrolytic plating, well known to those skilled in the art. Metal liners 46a and 50a are preferably respectively formed such as to be in electrical contact with residual metal layers remaining from patterned metal layers 14 and 16, as best shown in FIG. 6. Dielectric materials 46b and 50b conveniently provide filler material for the vias 46 and 50. Some embodiments of the invention provide for metal (e.g., copper) capping (not shown) of the vias 46 and 50. In another preferred embodiment of the invention, as best shown in FIG. 7, one or more metal-lined blind vias my be formed, such as metal-lined blind vias 54 and 58. To form metal-lined blind vias 54 and 58, blind-via openings are respectively drilled through metal layers 40 and 42 and through dielectric layers 30 and 32 down to any suitable residual metal layer(s) remaining from patterned metal layers 14 and 16. The formed blind-via openings are then metal-lined with metal (e.g., copper) liners 54a and 58a by sputtering or by e-less plating in combination with electrolytic plating, and subsequently filled with dielectric sputtering or by filler materials 54b and 58b disposed by screen printing or lamination. Metal liners 54a and 58a are in electrical contact with residual metal layers remaining from patterned metal layers 14 and 16.

Figure 5:
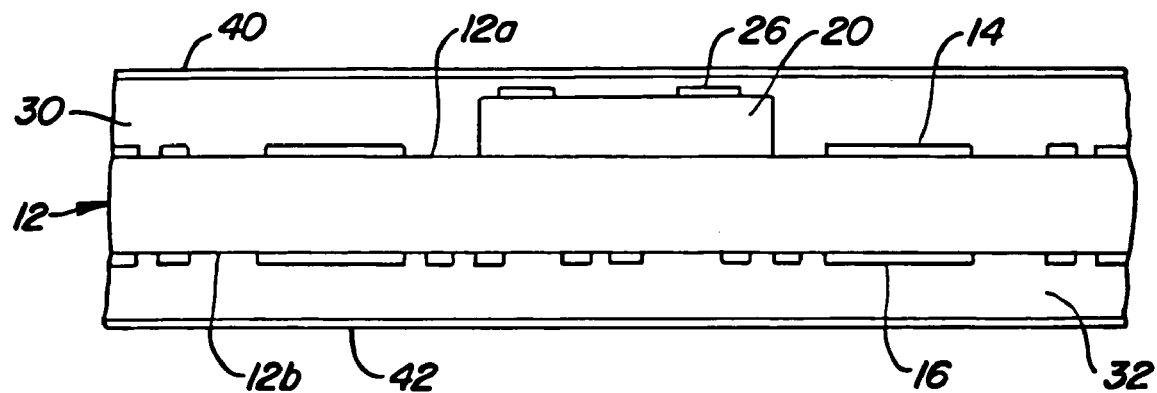
FIG. 5 is a side elevational view of the core substrate assembly of FIG. 4 after a first metal layer has been laminated on the dielectric layer disposed over the patterned upper metal layer and the prefabricated, integrated electronic component and a second metal layer has been laminated on the dielectric layer disposed over the patterned lower metal layer
Figure 8:
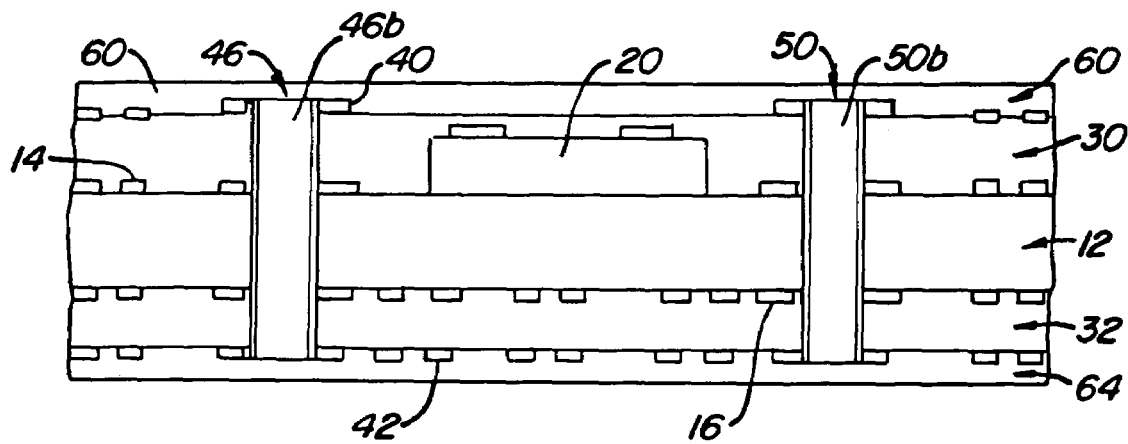
FIG. 8 is a side elevational view of the core substrate assembly of FIG. 7 after the first and second metal layers were patterned, and after an upper dielectric layer has been disposed over the patterned first metal layer and after a lower dielectric layer has been disposed over the patterned second metal layer.
Figure 9:
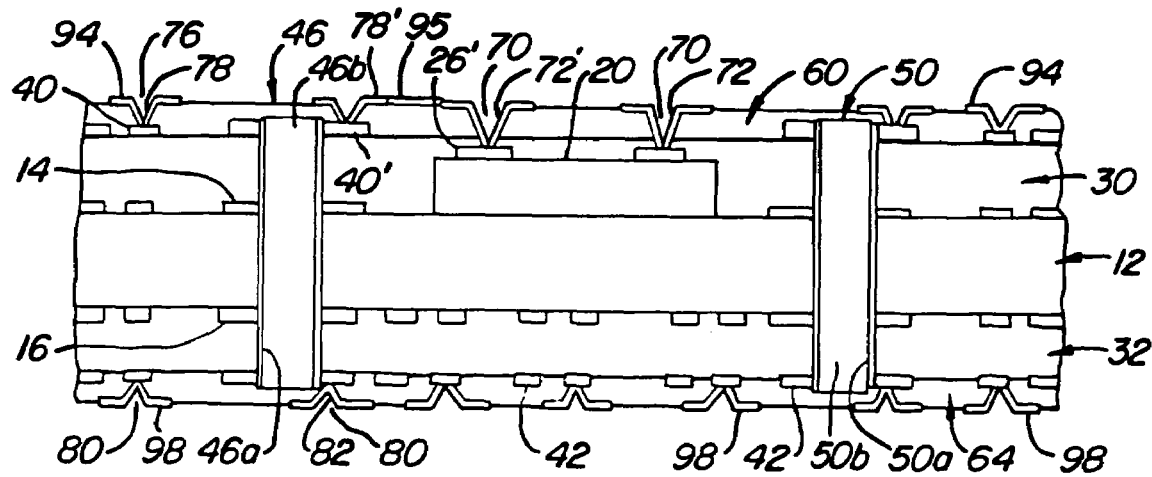
FIG. 9 is a side elevational view of the core substrate assembly of FIG. 8 after a plurality of metal-lined openings were formed through the upper and lower dielectric layers down respectively to the patterned first and second metal layers, and after a pair of metal-lined openings were formed through the upper dielectric layer down to pads on the prefabricated integrated electronic component.

After the desired number of vias have been formed in the circuit board assembly of FIG. 5, metal layers 40 and 42 are patterned as desired. Subsequently, dielectric layers 60 and 64 are respectively disposed over patterned metal layers 40 and 42 and over vias 46 and 50, as best shown in FIG. 8. (Note: Optionally the material for dielectric layers 60 and 64 may form the filler materials 54b and 58b.) A pair of openings 70 is then formed (e.g., such as by laser drilling or the like) through dielectric layer 60, and at least partly through dielectric layer 30 to expose pads 26 of the integrated circuit component 20. Openings 70 are then metal-lined with a suitable metal (e.g. copper) 72 into electrical contact with pads 26. Such metal-lining may be accomplished by any conventional process, such as by sputtering or by the combination of e-less and electrolytic plating. In addition to openings 70, a plurality of additional openings 76 and 80 may be respectively formed through respective dielectric layers 60 and 64, down to residual metal layers(s) remaining from patterned metal layers 40 and 42, respectively. Openings 76 and 80 are then metal-lined by any conventional process to respectively dispose metal liners 78 and 82 in openings 76 and 80. Subsequently metal layers 94 and 98 may be disposed in dielectric layers 60 and 64 and patterned, such that residual metal layers 94 and 98 are respectively coupled to residual metal layers 40 and 42, respectively, by and through metal liners 78 and 82. Additionally, the circuit board assembly can provide contact between pads 26 and layer 40 through the use of additional conductive layers on the dielectric layers, as is well know in the art. For example, FIG. 9 shows a connection between pad 26' and layer 40'. Pad 26' is in electrical contact with liner 72' and layer 40' is in electrical contact with liner 78', as described above. A conductive layer 95 on dielectric layer 60 connects liners 72' and 78', thereby providing electrical connection between pad 26' and layer 40'. The printed circuit board assembly in FIG. 9 comprises an integrated-electronic-component embedded laminated board which is available for dielectric build-up by means well known to those skilled in the art (e.g., post plating for stacked via build-up structures).

Suitable dielectric material for the core 12 and/or filler material 46b and 50b, and/or dielectric layers 30, 32, 60, and 64 include B-stage polymeric compounds, such as polyimides, epoxy resins, polyurethanes or silicons, well known to those skilled in the art. Additional suitable material include any material(s) wherein vias may be formed by one or more of the following methods, by way of example only: photoimageable, laser ablation, plasma and/or chemical etching. For example, suitable materials could include, as illustrated in U.S. Pat. No. 5,579,573 incorporated herein by reference thereto, thermosetting materials, such as high glass transition anhydride-cured epoxy composition. More particular suitable thermoset materials include, but are not limited to, one or more compounds selected from group consisting of epoxies and modified epoxies, melamine-formaldehydes, urea formaldehydes, phelonic resins, poly(bismaleimides), acetylene-terminated BPA resins, IPN polymers, triazine resins, and mixtures thereof A subsequent heating step may be preferably necessary to partially react the suitable material into a "B-stageable" thermoplastic-like material, capable of reflowing and/or curing the material of the core 12 and/or filler material 46b and 50b, and/or dielectric layers 30, 32, 60 and 64 into a ternary matrix upon additional exposure to heat and pressure. Additional suitable material for the core 12 and/or filler material 46b and 50b, and/or dielectric layers 30, 32, 60 and 64 may include high temperature thermoplastic materials such as liquid crystal polyesters (e.g., Xydar.™. or Vectra.™.), poly-(ether ether ketones), or the poly(aryl ether ketones). Further additional suitable thermoplastic materials include, by way of example only, ABS-containing resinous materials (ABS/PC, ABS/polysulfone, ABS/PVC), acetals acrylics, alkyds, allylic ethers, cellulosic esters, chlorinated polyalkylene ethers, cyanate, cyanamides, furans, polyalkylene ethers, polyamides (Nylons), polyarylene ethers, polybutadienes, polycarbonates, polyesters, polyfluorocarbons, polylimides, polyphenylenes, polyphenylene sulfides, polypropylenes, polystyrenes, polysulfones, polyurethanes, polyvinyl acetates, polyvinyl chlorides, polyvinyl chloride/vinylidine chlorides, polyetherimides, and the like, and mixtures of any of the foregoing.

Thus, by the practice of the present invention there are provided apparatuses and methods of including and/or embedding components in manufacturing electronic substrates, such as printed circuit boards. The electronic components include normally detached integrated electronics or passive electronics, with specific embodiments including petrovskite capacitance materials such as PZT and BST. Some of these electronic materials require high temperature processing (e.g., temperatures>600.degree. C.), and thus cannot be fabricated directly onto materials, such as a PCB, which cannot tolerate high temperature processing. Embedding components enables high frequency applications and frees up space on a printed circuit.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the teachings of the invention without departing from the essential scope and spirit of the present invention. It is intended that the invention not be limited to the particular embodiment disclosed as the best mode contemplated for carrying out this invention, but that the invention will include all embodiments and equivalents falling within the scope of the appended claims.

What is claimed is:

1. A method for producing a circuit board having an integrated electronic component comprising:
    providing a circuit board substrate having a first substrate surface and a second substrate surface;
    securing a first integrated electronic component to the first substrate surface;
    disposing a first dielectric layer on the first substrate surface and over the first integrated electronic component;
    disposing a metallic layer on the first dielectric layer to produce an integrated electronic component assembly comprising the circuit board substrate, the first integrated electronic component, first dielectric layer, and the metallic layer;
    producing in the integrated electronic component assembly at least one via, said via passing through said circuit board substrate from said first substrate surface to said second substrate surface and passing through the first dielectric layer, and the metallic layer;
    forming a metal lining in said via in contact with said metallic layer;
    disposing a second dielectric layer over said via and over said metallic layer;
    producing at least one opening in the second dielectric layer and in the first dielectric layer to expose at least part of the first integrated electronic component; and
    forming a metal lining in said opening and coupled to the first integrated electronic component to produce a circuit board having at least one integrated electronic component.

2. The method of claim 1 wherein said circuit board substrate includes a first metallic layer disposed on said first substrate surface and a second metallic layer disposed on said second substrate surface.

3. The method of claim 2 wherein said circuit board substrate comprises a multilayer core substrate.

4. The method of claim 2 additionally comprising patterning said first metallic layer to expose at least a portion of said first substrate surface, said first integrated electronic component being secured to said portion of said first substrate surface.

5. The method of claim 4 additionally comprising patterning said second metallic layer to expose at least a portion of said second substrate surface.

6. The method of claim 5 additionally comprising connecting a second integrated electronic component to said portion of said second substrate surface.

7. The method of claim 5 additionally comprising forming a cavity in said portion of said second substrate surface, and disposing a second integrated electronic component in said cavity.

8. The method of claim 4 additionally comprising disposing a patterned metallic layer over the second dielectric layer.

9. The method of claim 1 wherein said circuit board substrate comprises a multilayer core substrate.

10. The method of claim 1 wherein said first integrated electronic component includes at least one first pad in contact with said metal lining in said opening.

11. The method of claim 1 additionally comprising producing in the integrated electronic component assembly at least one blind via through said metallic layer and through said first dielectric layer, said blind via being lined with a metal liner which is coupled to said metallic layer.

* * * * *